United States Patent
Avanzino et al.

(10) Patent No.: US 6,169,034 B1
(45) Date of Patent: Jan. 2, 2001

(54) CHEMICALLY REMOVABLE CU CMP SLURRY ABRASIVE

(75) Inventors: Steven C. Avanzino, Cupertino; Darrell M. Erb, Los Altos; Diana M. Schonauer, San Jose; Kai Yang, Fremont, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/199,352

(22) Filed: Nov. 25, 1998

(51) Int. Cl.[7] .................................................. H01L 21/461
(52) U.S. Cl. ............................ 438/693; 438/687; 134/1.3
(58) Field of Search ..................................... 438/689, 691, 438/692, 693, 627, 687; 134/1.3, 6

(56) References Cited

U.S. PATENT DOCUMENTS

| | | |
|---|---|---|
| 5,662,769 | 9/1997 | Schonauer et al. . |
| 5,693,563 | 12/1997 | Teong . |
| 5,772,780 * | 6/1998 | Homma et al. ........................... 134/7 |
| 5,789,360 * | 8/1998 | Song et al. ............................ 510/175 |
| 5,931,718 * | 8/1999 | Komanduri et al. ..................... 451/36 |
| 5,954,997 * | 9/1999 | Kaufman et al. ..................... 252/79.1 |
| 5,958,794 * | 9/1999 | Bruxvoort et al. ................... 438/692 |
| 5,976,267 * | 11/1999 | Culkins et al. ........................... 134/6 |
| 5,996,594 * | 12/1999 | Roy et al. ............................... 134/13 |
| 6,001,730 * | 12/1999 | Farkas et al. ......................... 438/627 |
| 6,026,830 * | 2/2000 | Huang .................................... 134/66 |
| 6,043,146 * | 3/2000 | Watanabe et al. .................... 438/623 |
| 6,043,155 * | 3/2000 | Homma et al. ....................... 438/691 |

OTHER PUBLICATIONS

Chang and Sze, ULSI Technology, 1996, The McGraw–Hill Companies, Inc., pp. 394–395.*

* cited by examiner

*Primary Examiner*—Matthew Smith
*Assistant Examiner*—Robert A. Hullinger

(57) ABSTRACT

Abrasion of Cu metallization during CMP is reduced and residual slurry particulate removal facilitated by employing a CMP slurry containing a dispersion of soft mineral particles having high solubility in dilute acids. Embodiments include CMP Cu metallization with a slurry containing magnesium oxide particles and removing any residual magnesium oxide particles after CMP with an organic acid, such as citric acid or acetic acid, or a dilute inorganic acid, such as hydrochloric, phosphoric, boric or fluoboric acid.

15 Claims, 4 Drawing Sheets

CHEMICALLY REMOVABLE CU CMP SLURRY ABRASIVE

RELATED APPLICATION

This application contains subject matter similar to subject matter disclosed in copending application Ser. No. 09/199,266 filed on Nov. 25, 1998.

TECHNICAL FIELD

The present invention relates semiconductor devices comprising copper (Cu) and/or Cu alloy interconnection patterns. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, normally of doped monocrystalline silicon, and a plurality of sequentially formed interdielectric layers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trenches typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing an interdielectric layer on a conductive layer comprising at least one conductive pattern, forming an opening in the interdielectric layer by conventional photolithographic and etching techniques, and filling the opening with a conductive material, such as tungsten (W). Excess conductive material on the surface of the interdielectric layer can be removed by chemical-mechanical polishing (CMP). One such method is known as damascene and basically involves forming an opening and filling the opening with a metal. Dual damascene techniques involve forming an opening comprising a lower contact or via opening section in communication with an upper trench opening section, and filling the opening with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more, as in submicron technologies, the interconnection capacitance limits the circuit node capacitance loading and, hence, the circuit speed. As the length of metal interconnects increases, and cross-sectional areas and distances between interconnects decrease, the RC delay caused by the interconnect increases. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

Cu and Cu alloys have received considerable attention as a replacement material for Al in VLSI interconnection metallizations. Cu is relatively inexpensive, easy to process, has a lower resistivity than Al, and has improved electrical properties vis-à-vis W, making Cu a desirable metal for use as a conductive plug as well as conductive wiring. An approach to forming Cu plugs and wiring comprises the use of damascene structures employing CMP, as in Teong, U.S. Pat. No. 5,693,563. However, due to Cu diffusion through the dielectric interlayer, Cu interconnect structures must be encapsulated by a diffusion barrier layer. Typical diffusion barrier metals include tantalum (Ta), tantalum nitride (TaN), titanium (Ti), titanium tungsten (TiW), tungsten nitride (WN), and silicon nitride ($Si_3N_4$) for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology. For example, conventional practices comprise forming a damascene opening in an interdielectric layer and depositing a barrier layer, such as Ta or TaN, lining the opening and on the interdielectric layer. Cu or a Cu alloy is then deposited on the barrier layer filling the opening. CMP is then conducted employing an abrasive slurry. Conventional CMP slurries are typically aqueous suspensions comprising a particulate abrasive, such as alumina, an organic dispersant, and a suitable oxidizing agent. Other adjuvants can be employed to improve dispersibility or enhance performance. In CMP Cu and Cu alloy metallization, the CMP slurry typically contains a relatively large amount of a relatively hard particulate material, such as alumina, e.g. about 2 to about 3 wt. % of alumina. However, during conventional CMP, it was found that the planarized Cu or Cu alloy surface undergoes abrasion, i.e., scratching. In addition, conventional practices typically comprises mechanically removing remaining or residual slurry particles after CMP, as by buffing with water on a secondary platen buff pad, or by scrubbing with a polyvinyl acetate (PVA) foam brush material on a wafer scrubbing tool. Such mechanical removal of slurry particles is not particularly effective and may cause further scratching of the Cu surface.

Accordingly, there exists a need for CMP Cu methodology which enables a high degree of planarization without surface abrasion and which facilitates removal of residual abrasive slurry particles subsequent to CMP with a high degree of efficiency.

DISCLOSURE OF THE INVENTION

An advantage of the present invention is a method of manufacturing a semiconductor device comprising CMP Cu metallization to achieve a smooth surface and facilitate efficient removal of residual slurry particles subsequent to CMP.

Additional advantages and other features of the present invention are set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: depositing a layer of copper (Cu) or a Cu alloy; chemical mechanical polishing (CMP) the deposited Cu or Cu alloy with a slurry containing a particulate abrasive material; and removing remaining particulate material after CMP with a dilute acidic solution.

Embodiments include forming damascene openings in an interdielectric layer, depositing a barrier layer, such as Ta or TaN, lining the openings and on the interdielectric layer, depositing Cu or a Cu alloy on the barrier layer filling the opening, planarizing by CMP employing a slurry containing particulate magnesium oxide, and removing residual particulate magnesium oxide after CMP with a dilute organic acid, such as citric or acetic acid, or a dilute inorganic acid, such hydrochloric acid (HCl) or phosphoric acid ($H_3PO_4$).

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
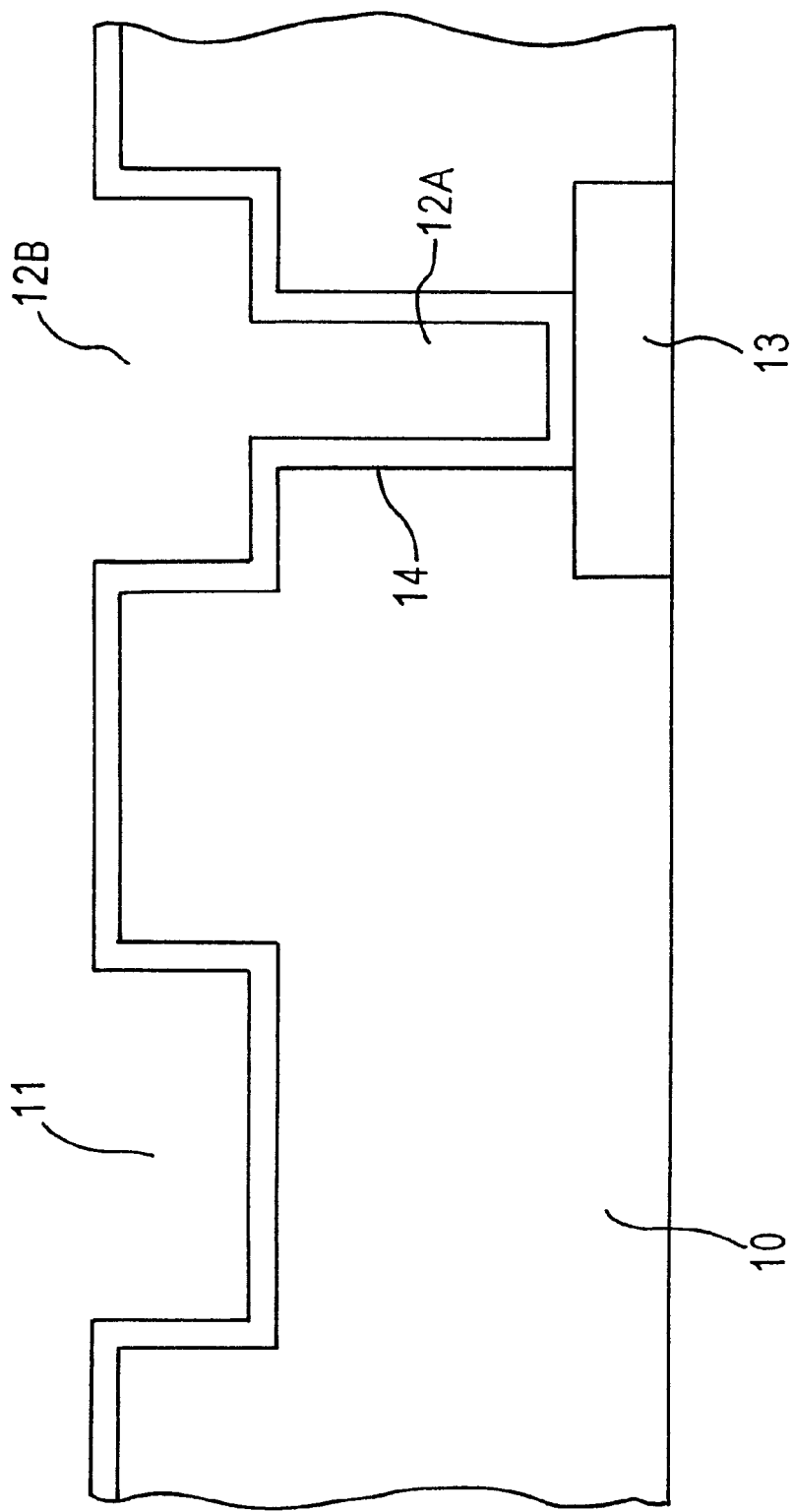
FIGS. 1–4 illustrate sequential phases of a method in accordance with an embodiment of the present invention.

The present invention addresses and solves problems attendant upon conventional CMP Cu methodology, such as surface scratching by relatively hard abrasive slurry particles and the difficulty in removing residual abrasive slurry particles subsequent to CMP, as by conventional mechanical buffing with water on a secondary platen buff pad, or scrubbing on a wafer scrubber. As employed throughout this application, the symbol Cu is intended to encompass high purity elemental copper as well as Cu-based alloys, such as Cu alloys containing minor amounts of tin, zinc, manganese, titanium and germanium.

Cu is a relatively soft metal, which lends itself to planarization by CMP. Oxidation of the Cu surface forms a passive layer which is subsequently removed by particle enhanced abrasion during CMP. The present invention is directed to planarizing Cu alloys by CMP to achieve a specular or smooth surface without scratches and abrasion by employing abrasive particles which do not have as high a hardness as particles conventionally employed in CMP slurries, such as alumina. Moreover, the present employs abrasive particles for Cu CMP slurries which can be removed chemically, rather than mechanically, e.g., buffing, as in conventionally practices. The chemical removal of slurry particles subsequent to CMP would ensure virtual complete removal of slurry particles in an efficient manner without additional abrasion of the planarized Cu or Cu alloy surface.

Embodiments of the present invention comprise CMP Cu employing a slurry containing a particulate material, such as a mineral, having a hardness no greater than about Mohs 6. Embodiments of the present invention further comprise selecting abrasive mineral particles for CMP Cu which it can be easily removed subsequent to CMP, as with a soluble dilute organic acid, e.g. citric acid, acetic acid, phthalic acid, tartaric acid or succinic acid, or a dilute inorganic acid, e.g. HCl, $H_3PO_4$, boric acid ($H_3BO_3$), or fluoroboric acid ($HBF_4$). Suitable minerals include metal oxides, particularly magnesium oxide. Magnesium oxide is highly soluble in citric acid and acetic acid and, hence, can be easily removed subsequent to CMP by treatment with a dilute organic acid, as by immersion or spraying. Magnesium oxide has a hardness of about Mohs 5.5, which is sufficient for CMP Cu.

Slurries suitable for CMP Cu in accordance with the present invention comprise about 1 wt. % to about 10 wt. % of magnesium oxide having a particle size of about 0.1 $\mu$m to about 3 $\mu$m, about 0.5 wt. % to about 5 wt. % of ammonium tartrate; about 0.1 wt. % to about 0.3 wt. % of benzotriazole, about 1 wt. % to about 5 wt. % hydrogen peroxide, and about 89.7 the remainder deionized water.

The use of a CMP slurry containing magnesium oxide in accordance with embodiments of the present invention enables CMP Cu metallization to a spectral or smooth surface finish without any significant abrasion, and further enables efficient and substantially complete removal of residual slurry particles subsequent to CMP. Accordingly, the present invention enables effective and efficient use of Cu or Cu alloy metallization in forming reliable interconnection patterns employing damascene technology in manufacturing submicron semiconductor devices, e.g., semiconductor devices having a design rule of about 0.18 micron and under.

Cu and/or Cu alloy interconnect members formed in accordance with embodiments of the present invention can be, but are not limited to, interconnects formed by damascene technology. Thus, embodiments of the present invention include forming an interdielectric layer overlying a substrate, forming one or more openings, e.g., damascene openings, in the interdielectric layer, depositing a diffusion barrier layer, such as Ta or TaN, lining the opening and on the interdielectric layer, and filling the opening with Cu or a Cu alloy by physical vapor deposition (PVD), CVD, electroless plating or electroplating. A conventional seed-layer can be deposited on the barrier layer when electroplating or electroless plating the Cu or Cu alloy layer. CMP is then conducted employing a slurry containing magnesium oxide which enables effective of planarization of the Cu metallization. Subsequent to Cu CMP, residual magnesium oxide slurry particles are easily removed by treatment with a dilute organic acid, such citric acid or acetic acid, or a dilute inorganic acid, such as HCl, $H_3PO_4$, $H_3BO_3$ or $HBF_4$.

In the various embodiments of the present invention, conventional substrates, interdielectric layers, and barrier layers can be employed. For example, the substrate can be doped monocrystalline silicon or gallium-arsenide. The dielectric interlayer employed in the present invention can comprise any dielectric material conventionally employed in the manufacture of semiconductor devices. For example, dielectric materials such as silicon dioxide, phosphosilicate-glass (PSG), boron doped PSG (BPSG), and silicon dioxide derived from tetraethylorthosilicate (TEOS) or silane by PECVD can be employed. Interdielectric layers in accordance with the present invention can also comprise low dielectric constant materials, including polymers, such as polyimides. The opening formed in dielectric layers are effected by conventional photolithographic and etching techniques.

Figure 2:
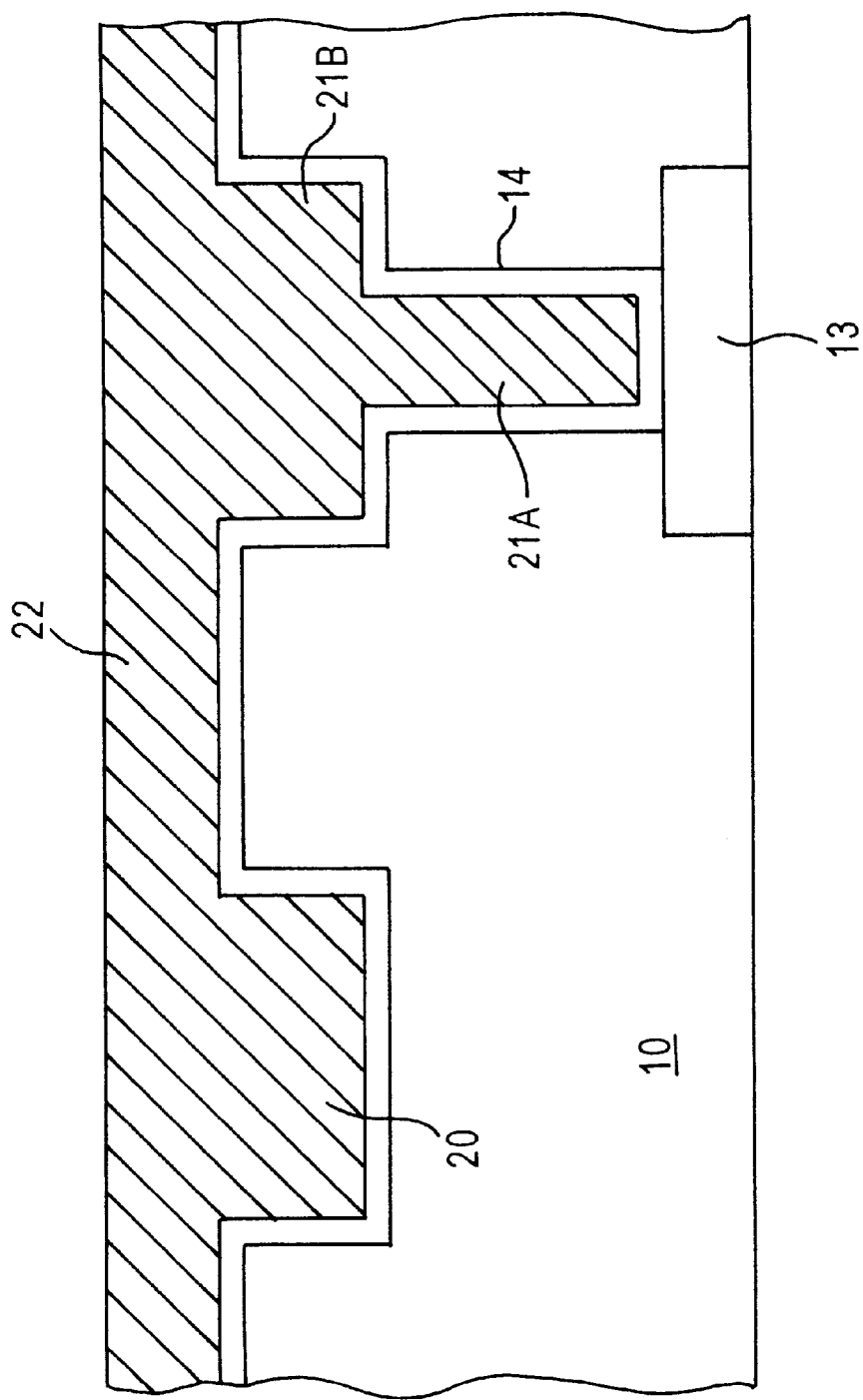

An embodiment of the present invention is schematically illustrated in FIGS. 1–4, wherein similar reference numerals denote similar features. Adverting to FIG. 1, a single damascene trench 11 and a dual damascene opening comprising a via hole 12A and trench 12B communicating with via hole 12A are formed in interdielectric layer 10. Via hole 12A communicates with underlying conductive feature 13. A barrier layer 14, such as Ta or TaN, is deposited by CVD lining trench 11 and the dual damascene opening 12A, 12B, and on the upper surface of interdielectric layer 10. Cu or a Cu alloy is then deposited to fill trench 11 and dual damascene opening 12A, 12B, as shown in FIG. 2. The Cu metallization filling trench 11 is designated by reference numeral 20, Cu metallization filling via hole 12A is designated by reference numeral 21A, and Cu metallization filling trench 12B is designated by reference numeral 21B. An upper layer of Cu metallization 22 is also formed on dielectric layer 10. The Cu metallization can be deposited in any conventional manner, as by PVD, CVD, electroplating or electroless plating. In depositing Cu metallization by electroless plating or electroplating, a conventional seed-layer (not shown for illustrative convenience) is deposited on barrier layer 14.

Figure 3:
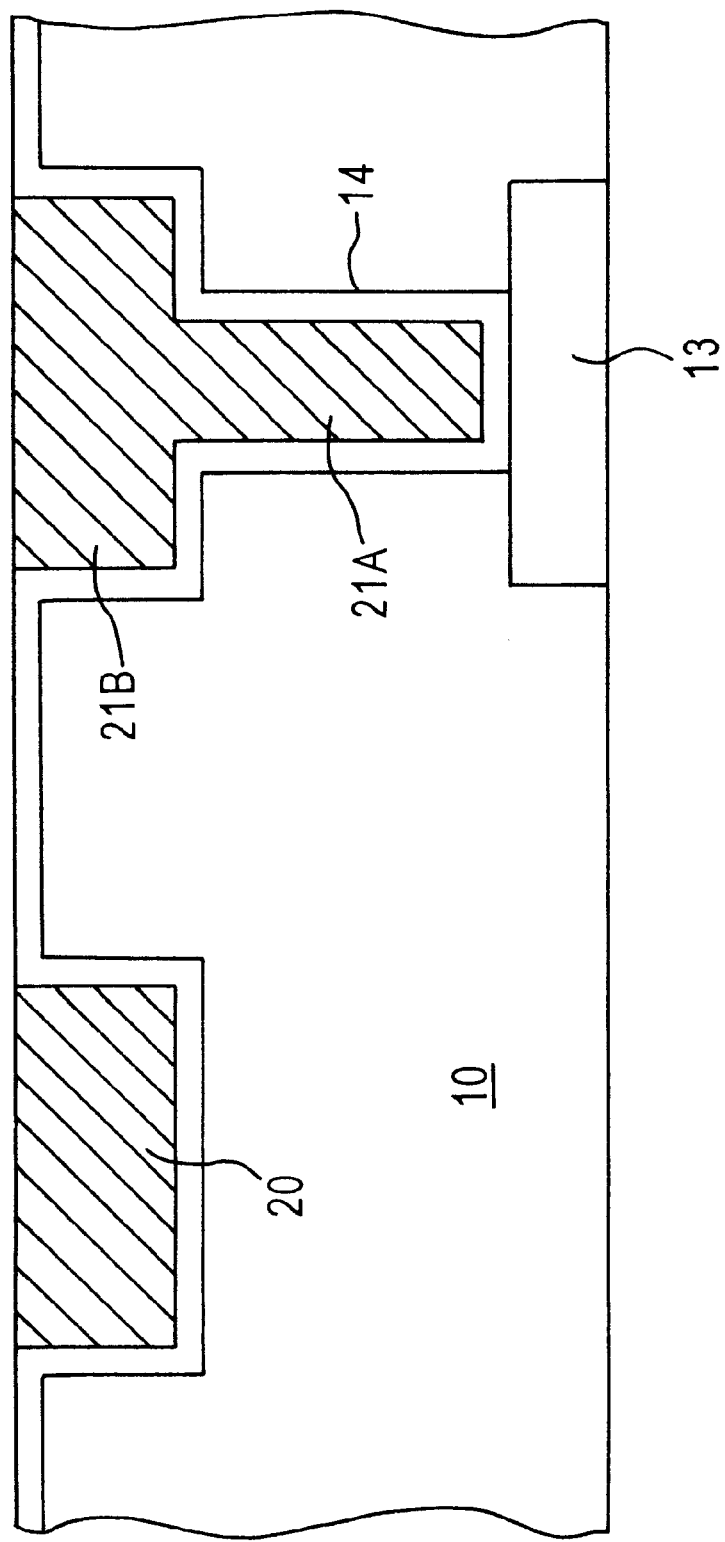
Figure 4:
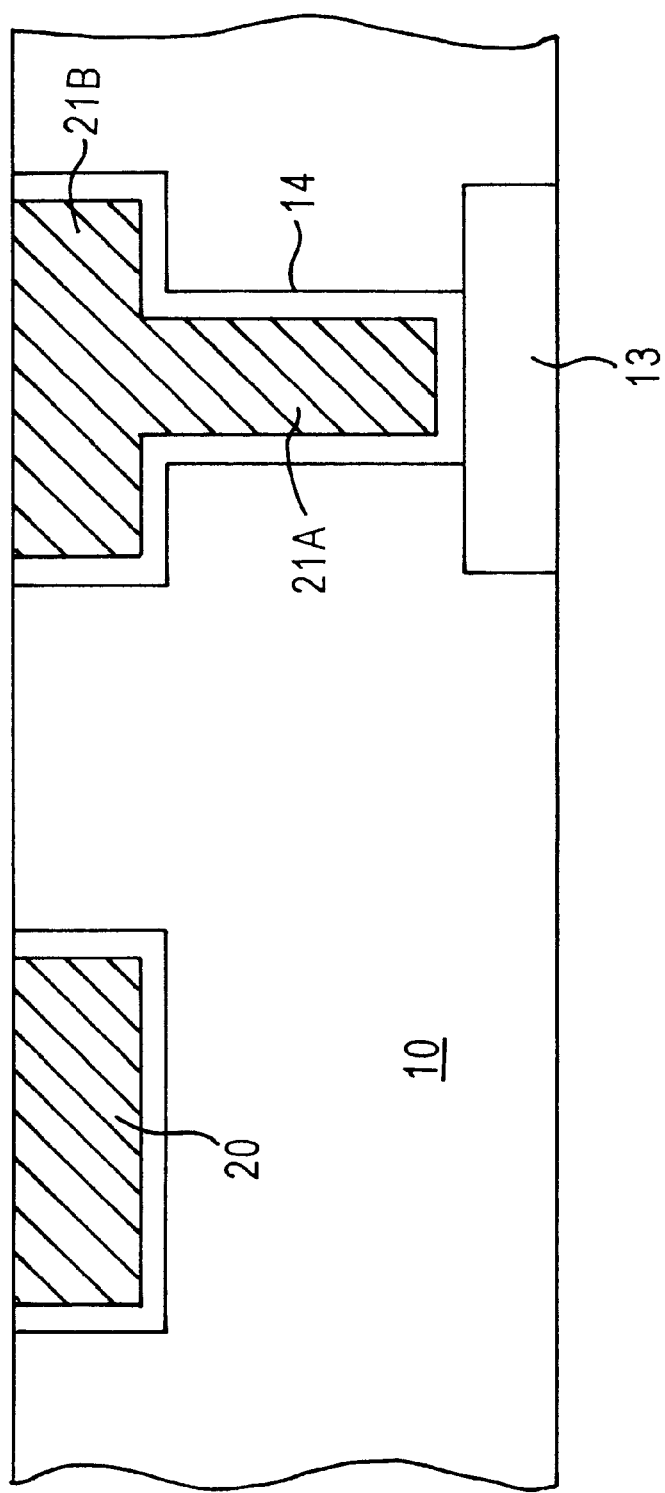

After Cu metallization, CMP is conducted employing a slurry in accordance with the present invention containing a relatively soft mineral, such as a metal oxide, e.g. magnesium oxide, which can effectively planarize the Cu metallization leaving a substantially smooth surface without abrasion. Moreover, subsequent to CMP, residual magnesium oxide particles are easily removed, as by rinsing, or brush scrubbing with a weak solution of an organic acid, such as about 1 to about 5 wt. % of acetic acid or citric acid, or a dilute solution of an inorganic acid, such as HCl, $H_3PO_4$, $H_3BO_3$, $HBF_4$. CMP is conducted stopping at barrier layer 14 as shown in FIG. 3. Subsequently, CMP is conducted to remove barrier layer 14 from the upper surface of interdielectric layer 10 leaving the planarized surface as shown in FIG. 4.

The present invention provides cost effective, efficient CMP Cu methodology employing a slurry containing a relatively soft mineral, such as a metal oxide, e.g., magnesium oxide, which enables planarization to achieve a smooth surface without abrasion. Removal of residual slurry particles subsequent to CMP is easily effected by treatment with a dilute organic acid, such as citric acid or acetic acid, or with a dilute inorganic acid.

The present invention enjoys industrial applicability in forming various types of inlaid Cu and Cu alloy interconnection patterns. The present invention is particularly applicable in manufacturing semiconductor devices having sub-micron features and high aspect ratio openings, e.g. semiconductor devices with a design rule of about 0.18 micron and under.

In previous descriptions, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   depositing a layer of Copper (Cu) or a Cu alloy;
   chemical mechanical polishing (CMP) the deposited Cu or Cu alloy with a slurry containing a particulate abrasive material having a hardness less than about Mohs 6; and
   chemically removing remaining particulate material after CMP with a dilute acidic solution without buffing or scrubbing.

2. The method according to claim 1, comprising removing dilute particulate material with a dilute solution of citric, acetic, phthalic, tartaric succinic, hydrochloric, phosphoric, boric, or fluoboric acid.

3. The method according to claim according to claim 1, wherein the particulate abrasive material comprises a mineral having a particle size less than 5 μm.

4. The method according to claim 3, wherein the mineral has a particle size of about 0.1 μm to about 3 μm.

5. A method of manufacturing a semiconductor device, the method comprising:
   depositing a layer of copper (Cu) or a Cu alloy;
   chemical mechanical polishing (CMP) the deposited Cu or Cu alloy with a slurry containing a particulate abrasive material; and
   chemically removing remaining particulate material after CMP with a dilute acidic solution of citric, acetic, phthalic, tartaric, succinic, hydrochloric, phosphoric, boric, or fluoboric acid, without buffing or scrubbing; wherein:
   the particulate abrasive material comprises a mineral having a particle size less than 5 μm and has a hardness less than about 6 Mohs; and
   the mineral comprises a metal oxide.

6. The method according to claim 5, wherein the mineral comprises magnesium oxide.

7. The method according to claim 6, wherein the slurry comprises about 1 wt. % to about 10 wt. % magnesium oxide.

8. The method according to claim 7, wherein the slurry further comprises:
   about 0.5 wt. % to about 5 wt. % of ammonium tartrate;
   about 0.1 wt. % to about 0.3 wt. % of benzotriazole;
   about 1 wt. % to about 5 wt. % hydrogen peroxide; and
   about 89.7 wt. % to about 98.4 wt. % of water.

9. The method according to claim 6, comprising:
   depositing an interdielectric layer over a substrate;
   forming damascene openings in the interdielectric layer;
   depositing a barrier layer lining the damascene openings and on the interdielectric layer;
   depositing the Cu or Cu alloy on the barrier layer filling the opening; and

CMP.

10. The method according to claim 9, comprising;

depositing a seedlayer on the barrier layer; and electroplating or electroless plating the Cu or Cu alloy on the seedlayer.

11. A method of manufacturing a semiconductor device, the method comprising:

depositing a layer of copper (Cu) or a Cu alloy;

chemical mechanical polishing (CMP) the deposited Cu or Cu alloy with a slurry containing a particulate abrasive material comprising magnesium oxide; and removing remaining particulate material after CMP with a dilute acidic solution.

12. The method according to claim 11, wherein the slurry comprises about 1 wt. % to about 10 wt. % magnesium oxide.

13. The method according to claim 12, wherein the slurry further comprises:

about 0.5 wt. % to about 5 wt. % of ammonium tartrate;

about 0.1 wt. % to about 0.3 wt. % of benzotriazole;

about 1 wt. % to about 5 wt. % hydrogen peroxide; and about 89.7 wt. % to about 98.4 wt. % of water.

14. The method according to claim 11, comprising:

depositing an interdielectric layer over a substrate;

forming damascene openings in the interdielectric layer;

depositing a barrier layer lining the damascene openings and on the interdielectric layer;

depositing the Cu or Cu alloy on the barrier layer filling the opening; and

CMP.

15. The method according to claim 14, comprising:

depositing a seedlayer on the barrier layer; and electroplating or electroless plating the Cu or Cu alloy on the seedlayer.

* * * * *